(12) United States Patent
Braun

(10) Patent No.: US 11,384,791 B2
(45) Date of Patent: Jul. 12, 2022

(54) DEVICE AND VACUUM CHAMBER

(71) Applicant: MAX-PLANCK-GESELLSCHAFT ZUR FÖRDERUNG DER WISSENSCHAFTEN E.V., Munich (DE)

(72) Inventor: Wolfgang Braun, Bietigheim-Bissingen (DE)

(73) Assignee: MAX-PLANCK-GESELLSCHAFT ZUR FÖRDERUNG DER WISSENSCHAFTEN E.V.

( * ) Notice: Subject to any disclaimer, the term of this patent is extended or adjusted under 35 U.S.C. 154(b) by 172 days.

(21) Appl. No.: 16/651,856

(22) PCT Filed: Sep. 24, 2018

(86) PCT No.: PCT/EP2018/075784
§ 371 (c)(1),
(2) Date: Mar. 27, 2020

(87) PCT Pub. No.: WO2019/063477
PCT Pub. Date: Apr. 4, 2019

(65) Prior Publication Data
US 2021/0372469 A1 Dec. 2, 2021

(30) Foreign Application Priority Data
Sep. 29, 2017 (DE) .......................... 102017122754.7

(51) Int. Cl.
*F16C 29/04* (2006.01)
*F16C 32/04* (2006.01)

(52) U.S. Cl.
CPC .......... *F16C 29/046* (2013.01); *F16C 29/048* (2013.01); *F16C 32/0472* (2013.01); *F16C 2300/62* (2013.01)

(58) Field of Classification Search
CPC ...... F16C 29/04; F16C 29/046; F16C 29/048; F16C 32/04; F16C 32/0402;
(Continued)

(56) References Cited

U.S. PATENT DOCUMENTS 5,331,861 A * 7/1994 Joffe ...................... F16C 29/002
  74/89.36
5,344,238 A * 9/1994 Roch ...................... F16C 29/04
  384/49

(Continued)

FOREIGN PATENT DOCUMENTS

DE          10227365 A1    1/2004
DE     102007012370 A1    9/2008
(Continued)

OTHER PUBLICATIONS

German Search Report for related German Patent Application No. 102017122754.7; dated Jul. 11, 2018; 8 pages.
(Continued)

*Primary Examiner* — Phillip A Johnson
(74) *Attorney, Agent, or Firm* — Dickinson Wright PLLC

(57) ABSTRACT

The present invention relates to an apparatus for sliding friction free and lubricant free movement in vacuum, wherein the apparatus has a fixed position rail and a rail movable relative thereto by means of magnetic force. The invention further relates to a vacuum chamber, for example for a coating plant having an apparatus in accordance with the invention.

25 Claims, 5 Drawing Sheets

Figure 3:
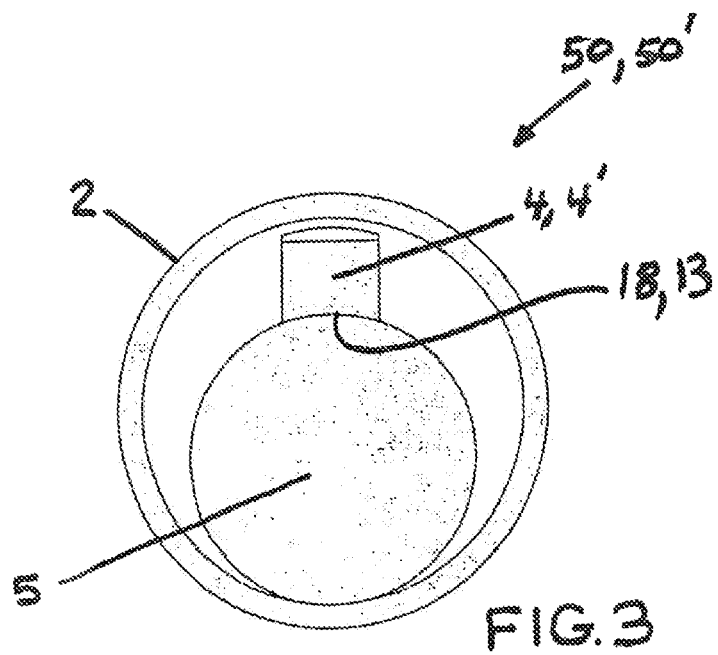

(58) Field of Classification Search
CPC .............. F16C 32/0412; F16C 32/0434; F16C 32/0472; F16C 2300/62; H01L 21/677422; H01L 21/67748; H01L 21/67754; H01L 21/67739; H01L 21/67745; H01L 21/67751; H01L 21/67757; H01L 21/6776; H01L 21/67709; H01L 21/67706
See application file for complete search history.

(56) References Cited

U.S. PATENT DOCUMENTS

| | | | | |
|---|---|---|---|---|
| 6,805,487 | B1 * | 10/2004 | Yuasa | F16C 33/748 384/16 |
| 8,216,422 | B2 * | 7/2012 | Kurita | F16C 29/045 156/345.54 |
| 2004/0013501 | A1 * | 1/2004 | Ackeret | H01L 21/67742 414/217 |
| 2007/0107739 | A1 | 5/2007 | Sato et al. | |
| 2017/0205601 | A1 | 6/2017 | Kim | |

FOREIGN PATENT DOCUMENTS

| | | |
|---|---|---|
| DE | 102011013245 A1 | 9/2012 |
| DE | 102012004082 A1 | 8/2013 |
| DE | 102013006322 A1 | 10/2014 |
| EP | 1705429 A2 | 9/2006 |

OTHER PUBLICATIONS

WO Search Report for related International Application No. PCT/EP2018/075784; dated Jan. 3, 2019; 13 pages.

* cited by examiner

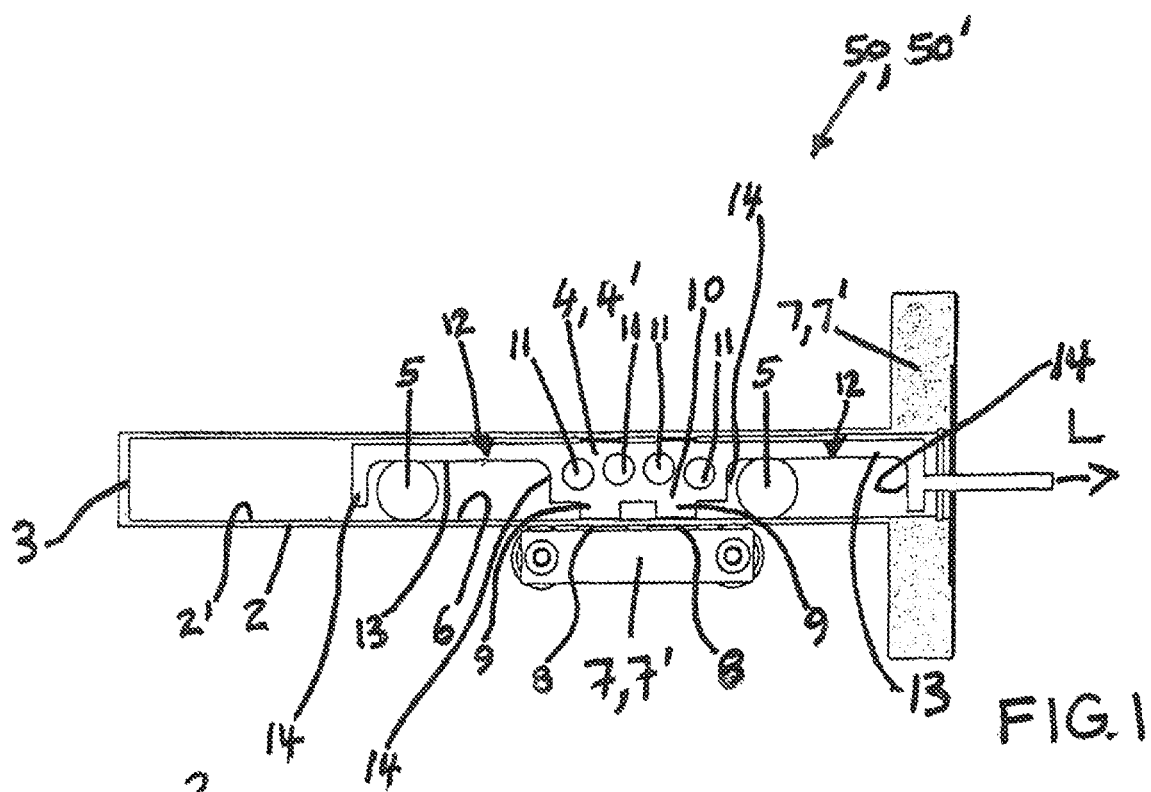
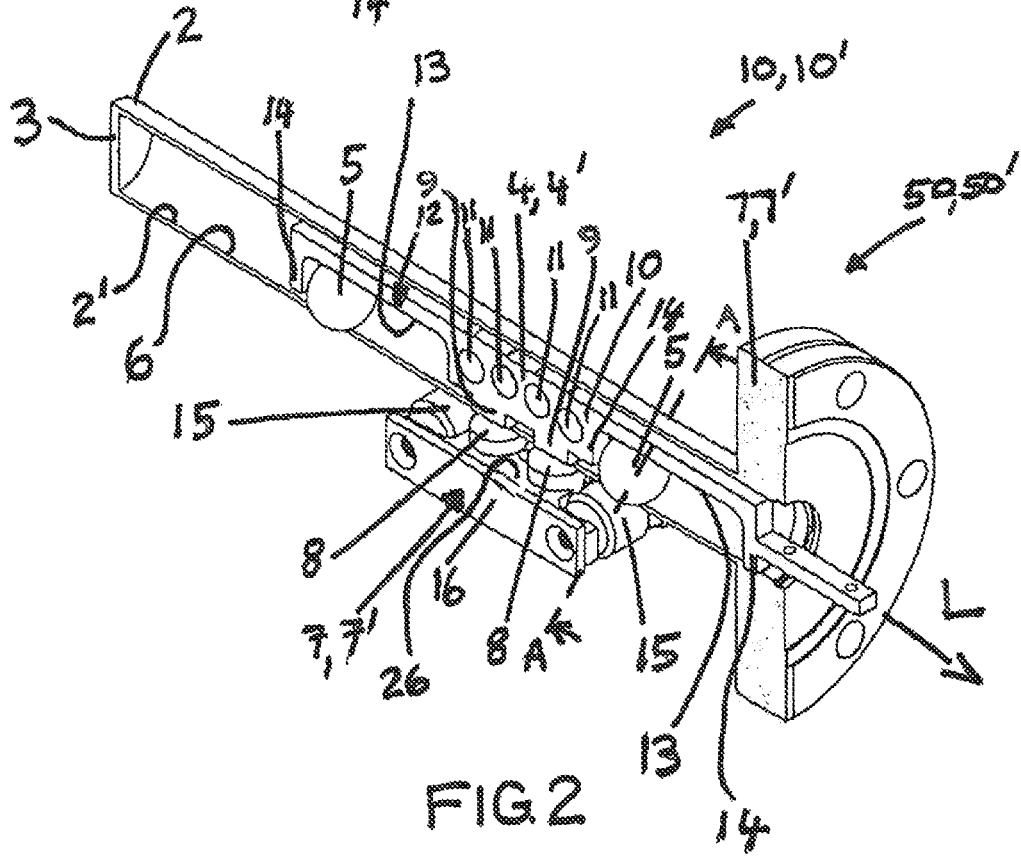

DEVICE AND VACUUM CHAMBER

CROSS REFERENCE TO RELATED APPLICATIONS

This application is a National Phase Application of Patent Application PCT/EP2018/075784 filed on Sep. 24, 2018, which claims priority to DE102017122754.7, filed Sep. 29, 2017, both of which are hereby incorporated by reference in their entirety.

The present invention relates to an apparatus for sliding friction free and lubricant free movement in vacuum, wherein the apparatus comprises a fixed position rail and a rail movable with respect thereto by means of magnetic force. The invention further relates to a vacuum chamber, for example for a coating plant, having an apparatus in accordance with the invention.

Many ultra-high vacuum plants and vacuum plants require mechanisms for the movement in vacuum, be this for the movement of stationary components, such as, for example, locking pushers or for the transfer of workpieces, e.g. in coating plants. The mechanisms must enable movements both within vacuum and also be able to transfer the movements from outside of the vacuum inwardly and vice versa.

In this respect at least with regard to ultra-high vacuum plants no lubricants or other materials with a measurable vapor pressure can be used in the chamber, due to the required residual pressure of $<10^{-7}$ Pa in the chamber. In order to avoid sliding friction in such ultra-high vacuum plants mechanisms have been suggested that use rolling cylinders that are linearly guided by means of edge-groove-interactions.

However, it has been found that the manufacture of these rollers and the associated guide teeth and guide tracks has to take place with very low manufacturing tolerances in order to achieve a smooth running and long operating times (lifetime).

Starting from this it is an object of the present invention to suggest a mechanism that can be manufactured in a more simple manner and which enables a smoother running of the apparatus and improved operating times also in an ultra-high vacuum in such a way that the mechanism can be used over longer periods of time in a reproducible manner.

This object is satisfied by the subject-matter having the features of claim 1.

Such an apparatus for sliding friction free and lubricant free movement in vacuum comprises:
  a fixed position rail,
  a rail movable by means of magnetic force,
  at least two, at most four, spherical-shaped bodies and/or balls that are configured to enable a movement, preferably a linear movement, of the movable rail relative to the fixed position rail, wherein the spherical-shaped bodies are arranged between the fixed position rail and the movable rail, as well as
  a unit which is configured to move the movable rail by means of magnetic coupling relative to the fixed position rail and in order to hold the movable rail stationary following a successful movement of the movable rail.

Due to the fact that no edge-groove-interactions and no cylinders are used the apparatus can be manufactured very simply and cost-effectively. For example, common balls that are sold as balls for ball bearings can be used in such a way that no complex cylinder shapes with notches have to be provided. Also, the construction of the movable rail and of the fixed position rail can be made in a significantly more simple manner, as these no longer have to have teeth cooperating with the cylinders.

Furthermore, it has been found that longer operating times can also be realized with point contacts that are made available by means of the spherical-shaped bodies. This is in contrast to the state of the art, where the use of cylinder surfaces is prescribed, as these are deemed to be significantly more loadable and wear resistant than the point contact of a ball. However, on use of the present invention, it has been found that the opposite is true, namely that longer operating times can be achieved by point contacts of a ball and/or of a spherical-shaped body than with the known cylinder shapes.

The spherical-shaped bodies are so to say configured for the purpose of guiding the movable rail in such a way that a linear movement of the movable rail is prescribed between at least two points. Through the use of point contacts, wear respectively abrasion can be strongly reduced which leads to an increase in the tool life.

A rail movable by means of magnetic force enables a drive of this, with the drive being transmittable from the outside, and with the drive not requiring an interface, for example, in a chamber wall of a vacuum chamber, as the drive can be established by means of magnetic coupling.

The apparatus enables a movement of a movable part (movable rail) along a straight track or a track curved in a plane (fixed position rail).

The invention thus describes a mechanics for sliding friction free linear or quasi linear movement components without lubricant, in particular in an ultra-high vacuum (UHV). The movement is enabled by rolling balls, wherein the penultimate degree of freedom of the moving body is determined by a magnetic coupling through the housing from the air side on use in vacuum from the air side through the housing. This coupling at the same time serves for the transfer of force and movement.

The forces are dimensioned in such a way that only rolling friction occurs and that sliding friction is avoided. Through a guidance of the balls by means of static friction the apparatus is free of sliding friction and due to the missing sliding friction, no lubrication is required such that this can also be operated free of lubricants. For example, the apparatus can be used for more than $3\times10^7$ cycles without a lubrication (in UHV) having to take place. Thus, the mechanism achieves reliability characteristics which exceed the state of the art by more than a factor of 100. The pressure increase when actuating the apparatus at 7.5 Hz lies at $\leq 5\times10^{-13}$ mbar ($5\times10^{-11}$ Pa) in comparison to a non-moved apparatus in such a way that the achieved purity characteristics likewise exceed the state of the art by more than a factor of 100.

The magnetic coupling is carried out in such a way that also a force can be transferred along the track. This serves for the displacement of the movable rail.

The DE 10 2007 012 370 A1 shows an apparatus in which cylindrical rollers are configured for carrying out the movement of a movable rail relative to a fixed position rail. Hereby a stable storage of a body is described by means of at least three points of contact, respectively three lines of contacts. A significant aspect of the present invention is; however, that the apparatus in accordance with the invention only requires two points of contact in order to still achieve a stable storage of the movable rail. This takes place in accordance with the invention by a precise arrangement of the balls in such a way that the positioning in y and z in the y-z planes takes place relative to a movement axis of the movable rail by means of spherical centers, as well as by a rotation about the x-axis in connection with the magnetic coupling. Such a movement cannot be comprehended by means of a cylinder as it is described in the DE 10 2007 012 370 A1 and for this reason it is in no way obvious to replace a cylinder by a ball, since the person skilled in the art would have to assume that the required movement is not ensured by means of a ball.

It should furthermore be noted that a normal ball bearing has a certain clearance between the balls and the two rings. If contamination, e.g. a mineral dust seed, now arrives between the ball and one of the rings this is no problem as long as the dust seed is smaller than the clearance. However, if the dust seed is larger than the clearance the force that acts on the seed and its contact surface on the ball and the ring increases very rapidly and very strongly depends on the size of the seed, since both the balls as well as the rings are formed of hardened steel and for this reason large forces have to be used for their deformation. This can lead to fast wear and the destruction of the ball bearing in particular in vacuum. The contamination produces notches or abrasive material which adheres to the balls in the vacuum and rubs at the cage and in this way leads to a lot of material abrasion in a short period of time such that the ball bearings fail in a normal case of operation by a bending of the cage which then blocks the balls Having regard to the bearings disclosed in the present teaching this effect does not exist, since the surface pressure is magnetic and the force only varies significantly weaker with the spacing in comparison to steel. On passing over interfering particles the force acting on the ball on passing the particles is limited to the normal surface pressure which normally does not lead to a damage of the ball or of the track by the mineral dust seeds. Besides the reduction in wear through the avoidance of sliding friction thus also the wear due to foreign bodies arriving at the inner mechanism is minimal.

Finally, the disclosed bearings have no clearance due to the magnetic force which acts continuously. In contrast to normal ball bearings the balls and the races are always pressed against one another without a spacing with a constant force. The support is thus free of clearance in this direction and can be set in a more precise manner.

Preferably the movable rail has a separate surface for each spherical-shaped body, at which the spherical-shaped body such as e.g. a ball can lie. As soon as the movable rail is moved by means of the unit, the spherical-shaped bodies roll along the fixed position rail and thus enable a linear movement of the movable rail relative to the fixed position rail.

Preferably each separate surface has two abutments, with preferably each spherical-shaped body being configured to be moved linearly to and fro between the two abutments. The guidance of the movement takes place by surfaces arranged perpendicular to the plane of the track, preferably curved surfaces that are provided at the movable part and possibly at the fixed position track, with the guidance being transmitted by the spherical-shaped bodies, for example balls, with the balls rolling between the movable rail and the fixed position rail.

Preferably a path length which the linearly displaceable movable rail can travel is formed by spacing between at least two abutments minus the diameter of the spherical-shaped body. The movement range of the balls is limited by the abutments. In this way also the overall movement is limited to a finite section of the track.

In this connection it should be noted that the abutments can be provided at the movable rail or at the fixed position rail. Preferably they are provided at the movable rail.

The balls are held between the abutments by a correspondingly high magnetic force so strongly between the movable rail and the fixed position rail such that no sliding friction occurs. On a periodic movement the balls are in this way positioned between the end abutments such that the overall movement takes place free of sliding friction. In this way the abrasion is minimized.

In accordance with a preferred embodiment the movable rail comprises at least two recesses, with each recess being configured to receive a spherical-shaped body. A recess forms a predefined movement range which the movable rail can travel.

The two recesses can be arranged at one side of the movable range or as an alternative to this also on opposite sides of the movable rail.

Preferably each recess has the separate surface and the two abutments, wherein the two abutments are preferably arranged at least substantially perpendicular or perpendicular to the separate surface and the separate surface is arranged at least substantially in parallel to the fixed position rail. In this way the recesses define the movement range of the movable rail in a simple manner.

In accordance with a particularly preferred embodiment the movable rail comprises a coupling web that is configured for the magnetic coupling with the unit. Hereby a movement of the movable rail relative to the fixed position rail is induced by a movement of the coupling web.

Preferably the coupling web is provided adjoining at least one recess. In this way a drive of the movable rail can be induced next to the part of the movable rail which defines the movement range of the movable rail. Particularly preferably the coupling web is thus provided between the two recesses.

Preferably at least one guide groove is provided at the movable rail, preferably at the separate surface, in which the spherical bodies can be guided in order to predefine the linear movement of the movable rail. Moreover, in particular at least one guide groove is provided at the fixed position rail in which the spherical-shaped bodies are guided. Such guide grooves serve for a precise linear guidance of the movable rail relative to the guide rail.

Preferably two, in particular precisely two, spherical-shaped bodies are arranged in a plane in parallel to the linear movement direction of the movable rail.

On use of four movable spherical-shaped bodies two spherical-shaped bodies are preferably respectively arranged per plane and the two planes stand at least substantially perpendicular or perpendicular to one another.

In this connection it should be noted that the balls, on the one hand, are dimensioned as large as possible, in order to achieve an as large as possible radius of the rolling surfaces and in this way to minimize wear. On the other hand, they are dimensioned as small as possible such that the forces of inertia during an accelerating movement cannot lead to a sliding of the balls.

For fast movements it is generally advantageous to maintain the mass of the movable rail as small as possible. For this reason, the movable rail can have cutouts, such as e.g. grooves, notches or bores, for example in the central region, in order to reduce the mass of the movable rail.

Particularly preferably the fixed position rail is arranged between the unit and the movable rail, with the unit being configured to move the movable rail relative to the fixed position rail. In this way a compact setup can be ensured.

Preferably the movable rail and/or the coupling web comprises a magnetic material, preferably a non-ferromagnetic material. This means that no permanent magnets are provided in the vacuum, in this way the apparatus can also be operated in the UHV range. In this connection it should be noted that the movable rail is preferably configured in one piece in such a way that the balls, and possibly a holding element that is configured to hold the movable rail at a position, for example in a vacuum chamber, and the apparatus is composed of as few parts as possible. In this way a minimum surface area can be introduced into the vacuum, with the purity in the chamber being influenced as little as possible.

Preferably, the unit comprises magnets that are configured to move the movable rail, in particular linearly and to hold the moveable rail stationary.

Preferably the unit comprises a magnetic material and at least one pair of oppositely polarized magnets that make available the magnetic coupling for the movable rail. By means of such an arrangement ring-shaped field lines are generated that enable a particularly small magnetic scatter field besides the magnetic coupling between the unit and the movable rail.

Particularly preferably the unit comprises two rollers by means of which the unit can be displaced relative to the fixed position rail. Rollers enable a relatively low friction movement of the unit relative to the fixed position rail.

Optionally a second unit can be arranged on the opposite (top) side of the unit, with the second unit having weaker magnets that are mechanically coupled fixedly in the movement direction with respect to the first unit. This interacts magnetically at two additional tappets at the top side of the movable rail and increases the force that can be transmitted. Initially it stabilizes the movable rail with respect to rotational forces about the axis of the movement direction. Additionally, it reduces the contact pressure on the balls which further leads to a further reduced wear.

Optionally the unit can be formed of two parts "in two storeys", quasi as a mirror-image with respect to the arrangement in the vacuum. In this connection the storey closer to the housing moves at half the speed, this means like the balls in the vacuum. The storey lying further away from the housing moves like the movable rail. The coupling magnets for the movable rail are mounted on this plane arranged further away. If (magnetic) steel balls are used, then the coupling magnets can be arranged at the plane closer to the unit at the positions of the balls in the vacuum, with the magnets acting directly on the balls. This leads to a stronger guidance of the balls in the movement direction and in this way to a further reduced sliding friction and/or a higher possible acceleration prior to increased wear by sliding friction.

Optionally the unit is arranged in a guide that prescribes a movement range of the unit. By means of the guide one can ensure from the outside that the movable rail is moved in a prescribed movement range.

Preferably the movable rail is configured as a push rod in order to push objects that are arranged at the push rod, in particular to linearly push the objects. For example, the movable rail can displace apertures, targets, workpieces or the like in a vacuum chamber between a plurality of points in such a way that these can be introduced and removed on use.

Advantageously, the fixed position rail is formed by at least one chamber wall of a vacuum chamber. In this way a transfer of a movement in vacuum is enabled by means of magnetic force and two rolling spherical bodies between a fixed rail, that is composed of the chamber wall, and the movable rail.

On use of, for example, steel parts at the vacuum side, the vacuum chamber can be heated extremely highly, for example up to 400° C. On a simultaneous corresponding selection of materials at the air side also operating temperatures of >300° C. are possible here. The operating temperature of the apparatus is merely limited by the high temperature properties of the materials, for example of the used steel alloys of the apparatus.

In accordance with a further aspect the present invention relates to a vacuum chamber, for example to a coating plant, having an apparatus as it is described herein, as well as a push rod that is arranged at the movable rail and can, for example, displace an aperture between two points in space, with the apparatus being configured to move, preferably to linearly move, the push rod respectively the aperture in the vacuum chamber.

The advantages that were discussed in connection with the apparatus in accordance with the invention are true in an analogous way for the vacuum chamber in accordance with the invention.

Figure 4:
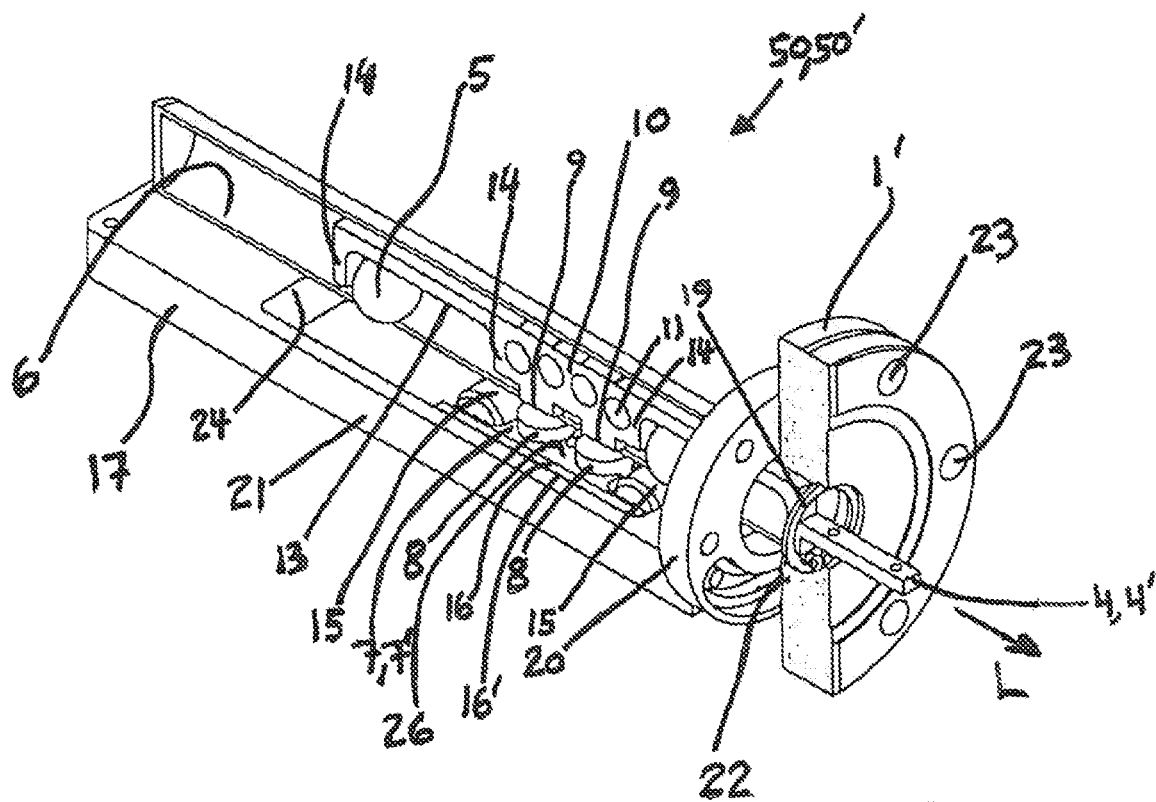
Figure 5:
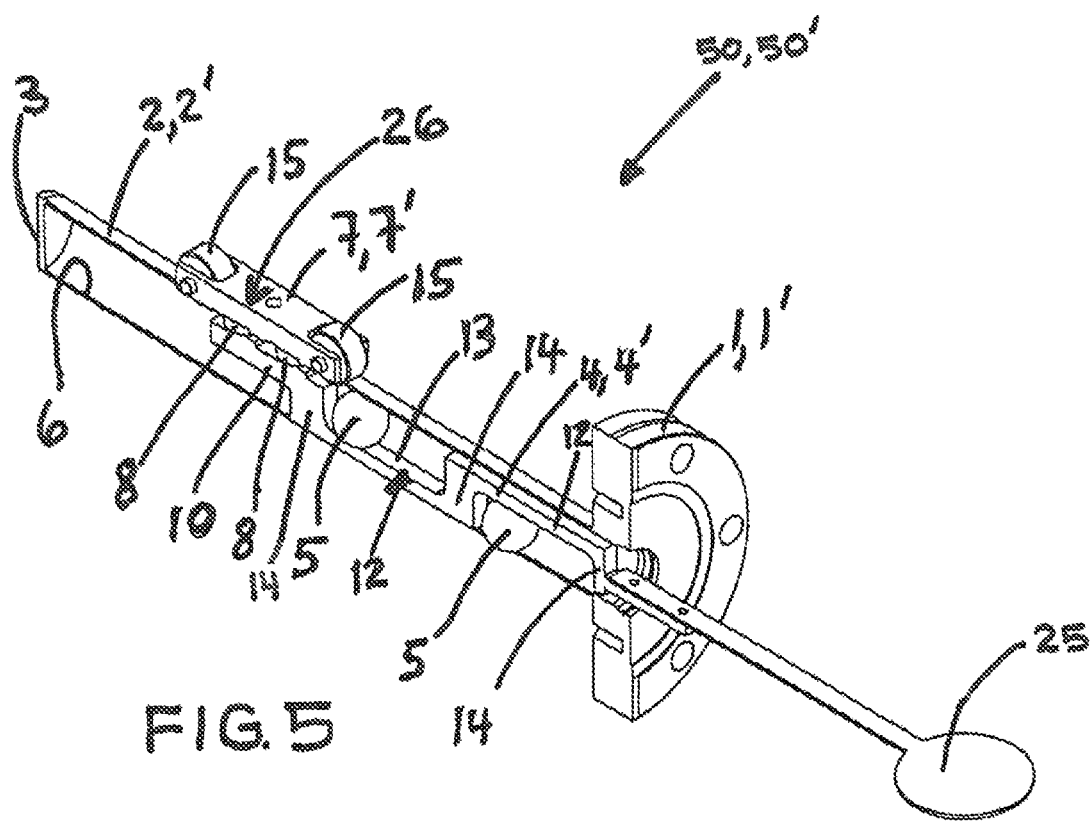
Figure 6:
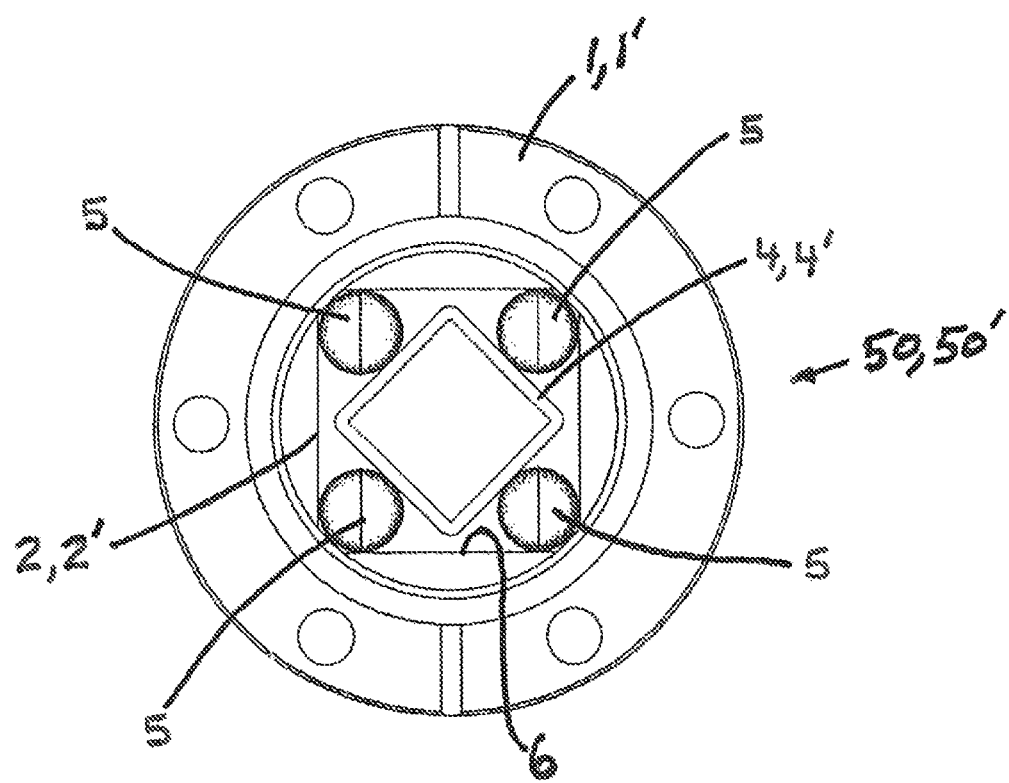
Figure 7:
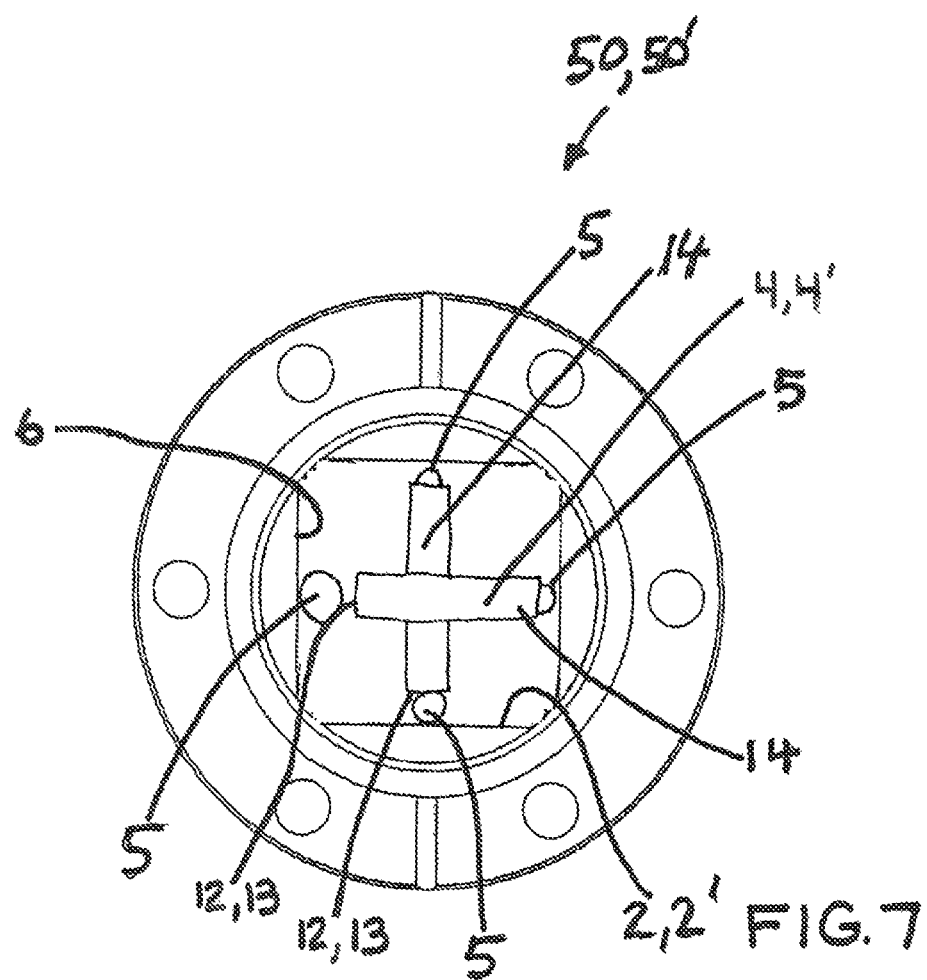
Figure 8:
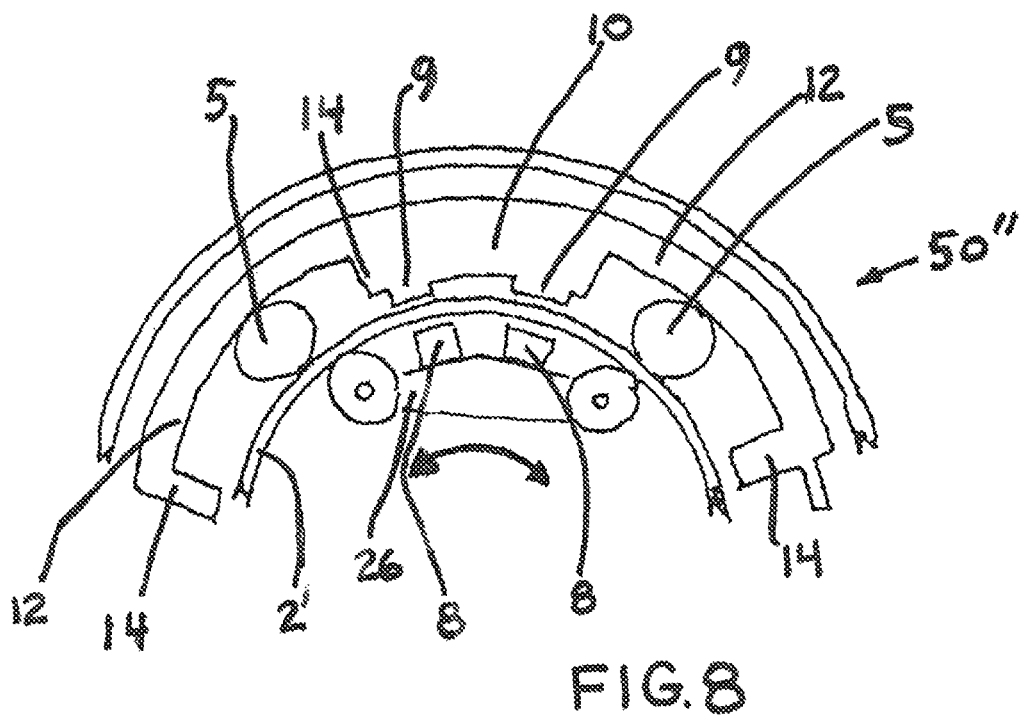
Figure 9:
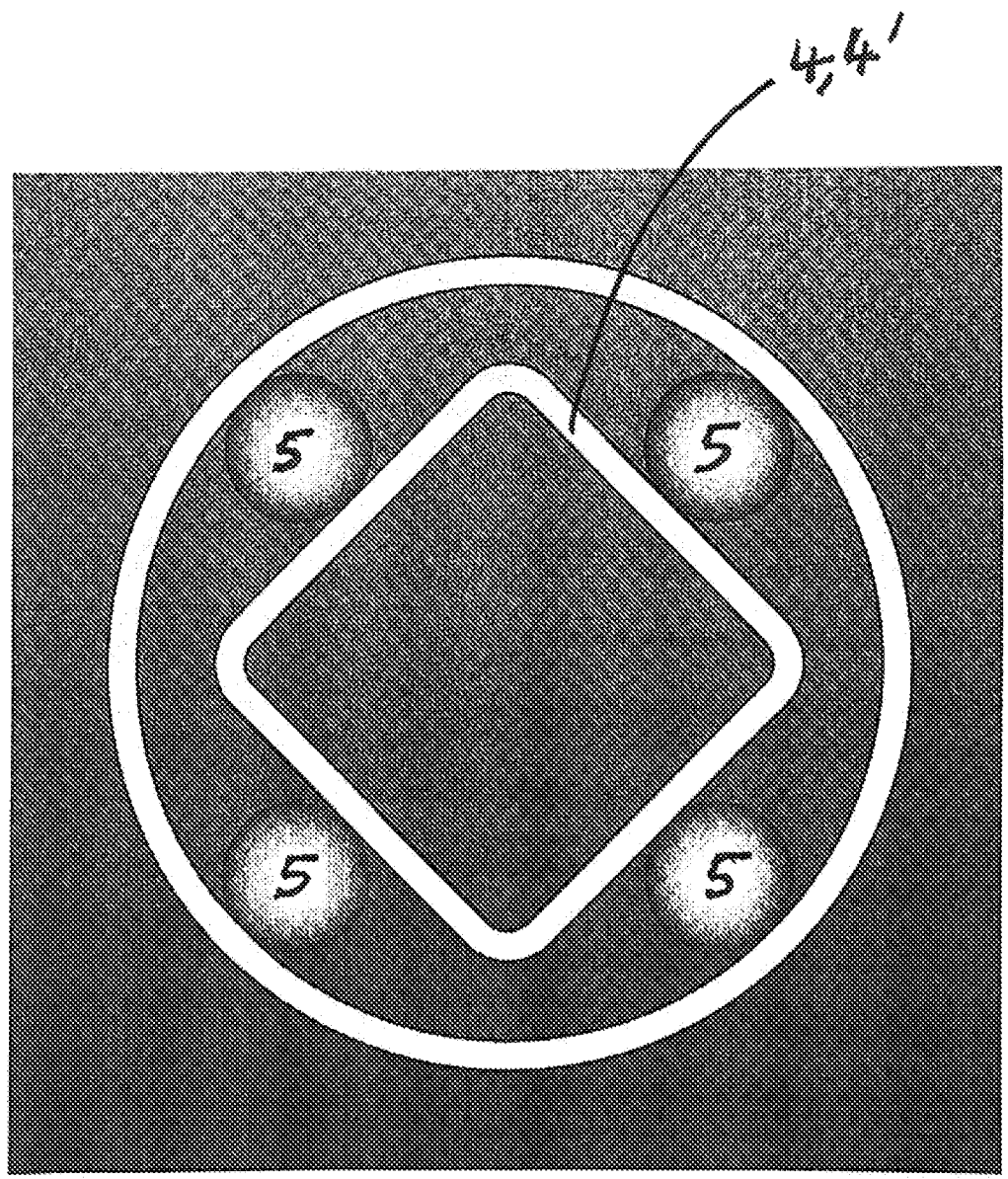

The invention will be described in the following purely by way of example with reference to the drawing in detail. There is shown:

FIG. 1 a schematic illustration of an apparatus in accordance with the invention in a sideview with a longitudinal section through the housing;

FIG. 2 an isometric view of the apparatus of FIG. 1;

FIG. 3 a section transverse to the longitudinal axis in the viewing direction along the sectional line A-A through the drawing of FIG. 2;

FIG. 4 a further isometric view of the apparatus of FIG. 1 with a magnetic trolley guide and a safety clip;

FIG. 5 a schematic illustration of a further apparatus in accordance with the invention;

FIG. 6 a schematic illustration of a further apparatus in accordance with the invention;

FIG. 7 a schematic illustration of a further apparatus in accordance with the invention;

FIG. 8 a schematic illustration of a further apparatus in accordance with the invention; and FIG. 9 a schematic illustration of a further apparatus in accordance with the invention.

The FIG. 1 shows a schematic illustration of an apparatus 50 in accordance with the invention by means of the example of a shutter mechanism 50' in a sideview with a longitudinal section through a housing 1. The housing 1 is in this exemplary design formed from an ultra-high vacuum flange 1 (stainless steel size DN CF40) having a non-magnetic stainless-steel tube 2 (size 18×1) welded thereto and a cover plate 3 welded thereto.

A movable rail 4' configured as a push rod 4, as well as two steel bores 5 are arranged in the housing 1. The push rod 4 is composed of a magnetic, non-ferromagnetic material in the specific case of stainless steel 1.4112. The adhesion force that can be achieved in this way is sufficient to achieve a correct function of the push rod 4 and further avoids the use of material such as NdFeB or CoSm, that as permanent magnets have a significantly stronger magnetic field, but are not readily compatible with ultra-high vacuum.

The push rod 4 merely lies at two points on the steel balls 5. The steel balls 5 roll along the lower inner surface 6 of the stainless-steel tube 2 and in this way enable a linear movement of the push rod 4. The stainless-steel tube 2 forms a fixed position rail 2' relative to which the movable rail 4' is movable.

The apparatus 50, 50' comprises a push rod 4, the fixed position rail 2', a unit 7 that has a magnetic trolley 7' and two balls 5 that are arranged between the fixed position rail 2' and the movable rail 4'. The movable rail 4' is simultaneously moved relative to the fixed position rail 2' by means of the unit 7 and is held relative to this by means of a magnetic coupling. For this purpose, the unit 7 has the magnetic trolley 7' which is equipped with two round magnets 8.

In the present example the rail magnets 8 have a diameter of 10 mm for a height of 5 mm. Generally speaking the round magnets can have a diameter selected in the range of 5 to 20 mm and can have a height of 3 to 10 mm. The round magnets 8 are manufactured of NdFeB.

The round magnets 8 couple magnetically with tappets 9 that are provided at the movable rail 4'. The tappets 9 are arranged at a coupling web 10 of the movable rail 4', in that these project from a lower side of the coupling web 10 in a direction of the inner surface 6. A movement of the movable rail 4' relative to the fixed position rail 2' is induced by a movement of the unit 7' and in this way of the coupling web 10.

In order to reduce a weight of the movable rail 4', the coupling web 10 further comprises four bores 11. In this example the sidewalls of the coupling web 10 also form the abutments 14. The recesses 12 are arranged at a side of the movable rail 4, namely on the same side of the movable rail 4' as the tappets 9.

The coupling web 10 is arranged between two recesses 12. Each recess 12 has a separate surface 13 at which the respective ball 5 lies and two abutments 14 that are arranged perpendicular to the separate surface 13. The respective ball 4 can be linearly guided to and fro between the two abutments 14 of a recess 12. The spacing between the two abutments 14 defines a path length which the linearly displaceable movable rail 4' can travel. The separate surface 13 is arranged in parallel to the fixed position rail 2'. A transition between the abutments 14 and the separate surface is configured as a curved surface in order to prevent fatigue breaks at this position and could also be formed as a rectangle or the like. The radius of curvature of the transition is smaller than the radius of the respective ball 5 in order to ensure that the ball 5 does not abut these transitions, but only firstly at the abutments 14.

A central body 26 (see FIG. 2) of the magnetic trolley 7 is likewise made of a magnetic material, in particular of stainless steel 1.4112. The round magnets 8 are placed with opposite polarization onto the magnetic trolley 7' to which the round magnets 8 adhere on their own due to their magnetism. A further holder is thus not required.

Through the opposite polarization (a magnet 8 with a north pole at the top, a magnet 8 with a north pole at the bottom) the magnetic field lines close to a ring that, apart from small gaps on the air side and the vacuum side, extends through the highly permeable material and in this way creates minimal scatter fields. It is thus advantageous to use an even number of coupling magnets arranged pairwise with oppositely oriented coupling magnets 8.

By means of the field lines the two tappets 9 and in this way the movable rail 4' is held stationary relative to the magnets 8. On movement of the unit 7 relative to the tube 2, the tappets 9 travel the movement of the unit due to the magnetic coupling in such a way that the movable rail 4' is guided in the same direction like the unit 7, namely in the direction of the longitudinal direction L.

The magnetic strength of the magnets 8 is selected as so strong as the movable rail 4' is drawn in the direction of the unit 7 and in this way in the direction of the balls 5 such that the balls 5 are so to say clamped between the movable rail 4' and the fixed position rail 2'. However, this clamping is not allowed to be so strong that the balls 5 no longer elastically roll on the two rails 4', 2', but are compressed so strongly that the balls and the rails mutually deform one another plastically and thereby mutually destroy one another by means of the resulting material wear ("fretting"). The setting of this clamping pressure is the substantial optimizing task for achieving, on the one hand, movements at high frequencies, or minimal wear, on the other hand.

The spacing of the axes of symmetry of the magnets 8 is preferably selected differently, preferably is selected slightly smaller than the spacing of the middle planes of the tappets 9. This results in a harder coupling in the movement direction, this means a faster increase in the restoring force on a relative deflection of movable rail 4' and unit 7' with respect to one another. Deviations of the width of the tappets 9 in the movement direction, of the diameter of the magnets 8, as well as generally deviating shapes of tappets 9 and magnets 8 can have the same effect and can be used for the further optimization.

The FIG. 2 shows an isometric view of the apparatus of FIG. 1. In this two plastic rollers 15 are provided at the magnetic trolley 7' in such a way that the magnetic trolley 7' can roll on the outside of the stainless-steel tube 2.

In this connection also ball bearings can be used, it has however, been shown that rollers of polyoxymethylene (POM) have an extremely good wear resilience (with lubrication of typically more than 30 million cycles) and are significantly quieter in operation.

The magnetic trolley 7' further has two glide plates 16 on opposites sides of which one is not visible in the shown Figure. The glide plates 16 are likewise manufactured of POM. The glide plates 16 support the magnetic trolley 7' at the magnetic trolley guide 17 (see FIG. 4) in such a way that the magnetic trolley 7' is moved along a straight line in parallel to the longitudinal axis L of the tube.

The FIG. 3 shows a section transverse to the longitudinal axis L in the viewing direction backwardly along the sectional line A-A through the drawing of FIG. 2. The surfaces 13 rolling on the balls 5 of the push rod 4 are manufactured curved as a guide groove 18. The guide groove 18 has a radius which is approximately 4% larger than the radius of the balls 5. This ratio of radii is used in most ball bearings and has also proven to be successful in this case. The difference of the radii is too small for this to be seen in the images.

The lateral guidance of the push rod 4 thus takes place through the outer positioning of the magnets which, besides the contact force of the movable rail 4' onto the balls and from the balls onto the fixed position rail 2' and the movement transition, can also exert a lateral restoring force, both through the inner curvature of the movable rail 4' lying on the balls 5 and the inner curvature of the tube 2 in which the balls 5 roll. The curvature of the tube 2 in this way takes on the function of a lower guide rail which is still realized in the state of the art by a further separate component and in this way forms a guide groove that is provided at the fixed position rail 2'.

The fixed position rail 2' is arranged between the unit 7 and the movable rail 4', with the movable rail 4' being movable relative to the fixed position rail 2'.

The FIG. 4 shows a further isometric view of the apparatus of the FIG. 1 with a magnetic trolley guide 17. The magnetic trolley guide 17 is typically manufactured of an anodized aluminum. It can be removed by means of two knurled screws (not shown) together with the magnetic trolley 7' without tools when the vacuum chamber 1 with a shutter mechanism 50' connected thereto should be heated.

The magnetic trolley guide 17 comprises a guide frame 21 and a holding ring 20 arranged perpendicular thereto. The guide frame 21 comprises an opening 24 in which the unit 7 having the magnetic trolley 7' is guided. The opening 24 is only marginally (approximately 0.2 mm) wider than the magnetic trolley 7', this means the spacing between outer surfaces 16' of the glide plate 16, in such a way that no significant lateral displacement is possible, hereby possibly resulting in deviations from a linear movement. The length of the opening 24 defines a path length which the magnetic trolley 7' can travel. The length of the opening in this way also corresponds to the path length that the movable rail 4' can travel in the tube 2. Since the magnetic coupling is not rigid, the length of the opening 24 is advantageously selected slightly smaller than the path length of the movable rail 4', before the balls 5 contact the abutments 14. In this way an overexcitation of the movable rail 4' on achieving the end position is possible without a ball 5 contacting an abutment 14.

A curved groove 22 for the connection screws (not shown) between the holding ring 20 and the guide frame 21 allows a stepless setting of the azimuthal position of the magnetic trolley 7'. The curved groove 22 is configured in such a way that it comprises more than one angular hole spacing on the partial circle of the fastening holes 23 of the flange 1' (in this case 60°) in such a way that the housing can be screwed practically in any arbitrary orientation onto the vacuum chamber; however, the shutter mechanism 10 can then always be operated in the shown vertical arrangement with the push rod 4 perpendicular over the balls. This is advantageous in order to ensure a uniform wear of the mechanical parts and in this way the maximum lifetime.

It has also been shown that the lifetime can be further increased when after a longer operating time the azimuthal position of the magnetic trolley is moved by a few degrees, whereupon the wear track on the fixed rail 2' is displaced onto a previously non-used surface.

The FIG. 4 further shows a safety clip 19 that prevents a falling out of the movable rail 4' and of the balls 5 for a decoupled magnetic trolley 7' from the tube 2, in particular when the apparatus 50 is coupled perpendicular to a vacuum chamber (not shown). The safety clip 19 is fastened in a groove at the inner surface 6 of the tube 2. The safety clip 19 can thus typically be inserted with plyers provided for this purpose and can then be removed again.

In this way no further tools are required for the assembly and disassembly of the apparatus 50. In particular no screwing connections, welding connections or rivet connections are required, which avoids accidental contaminations of the ultra-high vacuum by a contamination sitting in gaps or virtual leaks. With the exception of the housing 1 all parts coming into contact with the vacuum are manufactured from one piece in order to avoid this problem.

The housing 1 respectively the tube 2 which forms a chamber wall of a vacuum chamber serves as a fixed position rail 2', in this way the apparatus 50 is simple, robust and cost-effective in its manufacture.

The FIG. 5 shows a schematic illustration of a further apparatus 50 in accordance with the invention. In this apparatus 50 the balls 5 are arranged on opposite sides of the movable rail 4'. This variant can be formed a little shorter, since the magnetic trolley T only has to maintain the spacing with respect to the balls 5 at one side in such a way that it does not have to be attracted as strongly such that it will no longer be moved. Having regard to this variant in contrast to the variants shown in FIGS. 1 to 4, the coupling web 10 is provided adjoining only one recess 12. The central abutment 14 in this case forms an abutment for both recesses 12.

However, it has also been shown that the lateral (perpendicular to the image plane in FIG. 5) position of equilibrium in this variant is instable. This can be rectified by a second magnetic trolley (not shown) on the bottom side in the region beneath the rear ball 5. However, the dimensional tolerances relative to the shape of the push rod 4, the size of the balls 5 and the inner diameter of the tube 2 are summed up in such a way that an unnecessarily precise manufacture of this variant is required. This also has effects on the reliability. The variant with oppositely disposed balls 5 can however also be extended in two planes standing perpendicular to one another (see FIG. 7) which has significant advantages for large strokes.

Having regard to the variant shown in FIG. 5, an aperture 25 is provided at the push rod 4. Such an aperture 25 can, for example, be used in a coating plant, such as for example a molecular beam deposition plant.

The movable rail 4' is configured as a push rod 4 in order to linearly move objects, such as the aperture 25, to and fro, with the objects being arranged at the push rod 4.

FIG. 6 shows a schematic illustration of a further apparatus in accordance with the invention. Having regard to the embodiments shown in FIGS. 1 to 5 respectively exactly two balls 5 are arranged in a plane in parallel to the linear movement direction of the movable rail 4'.

Having regard to the variant shown in FIG. 6, like the variant in FIG. 7, respectively two pairs of balls 5 are provided in a rectangular tube 2. In the example of FIG. 6 a rectangular fixed position rail 2' is provided as a tube 2. The movable rail 4' is turned relative to the fixed position rail 2' by 45°. The four balls 5 are arranged in the spaces between the flat sides of the movable rail 4' and the edges of the fixed position rail 2'. In this way the four balls are provided in two planes, with the two planes standing perpendicular to one another and in parallel to the movement direction.

FIG. 7 shows a schematic illustration of a further apparatus in accordance with the invention. Having regard to this embodiment, the variant shown in FIG. 5 having oppositely disposed balls 5 is extended to a variant in which the movable rail 4' is quasi formed by two movable rails 4' such as they are shown in FIG. 5, standing perpendicular to one another.

In this way four recesses 12 are provided at a movable rail 4' that are arranged crosswise at opposite sides of the movable rail 4' with two recesses 12 being arranged in a front region of the movable rail 4' at a right angle with respect to one another such that their separate surfaces 13 are present facing the inner surface 6 of the quadratic tube 2. The two recesses 12 are likewise arranged at a right angle with respect to one another in the rear region of the movable rail 4' in such a way that their separate surfaces 13 are present facing the inner surface of the quadratic tube 2. A centrally arranged cross-shaped web (not shown) in this way forms an abutment 14 for all four recesses 12.

The four balls 5 are respectively arranged centrally at the flat sides of the fixed position rail 2' and in this way support the movable rail 4'. Having regard to this variant, two individual balls are provided per plane that stand perpendicular to one another.

For this purpose, the movable rail 4', similar to the movable rail 4' shown in FIG. 5, is configured in each plane, this means two balls 5 of the pairs of balls are arranged in a front region of the movable rail 4' and the other two balls 5 of the respective pair are arranged in a rear region of the movable rail 4'.

FIG. 8 shows a schematic illustration of a further apparatus in accordance with the invention 50". Having regard to this variant the resulting movement does not take place linearly, but along a circular arc. Such arrangements are possible both with convex as well as concave curvatures, even movements that do not take place on a circular track are possible, as long as a sufficiently small spacing remains between the coupling magnet 8 and the push rod 4 in the used region in order to ensure the functional capability.

FIG. 9 shows a schematic illustration of a further apparatus 50' in accordance with the invention similar to FIG. 6. In contrast to that of FIG. 6, the balls 5 are placed in a cylindrical tube 2 rather than in a rectangular tube 2 as a fixed position rail 2'. Respectively two pairs of balls 5 are arranged at oppositely disposed sides of the movable rail 4'. The four balls 5 are likewise provided in two planes, with the two planes standing perpendicular to one another and being arranged in parallel to the movement direction. Through the arrangement in a cylindrical outer tube 2, the balls 5 each only have contact by means of one contact point at the fixed position rail 2'. In FIG. 6 the balls respectively lie at two contact points at the fixed position rail 2'. Through the arrangement in FIG. 9 a rolling movement without the additional rotation about the contact points, similar to the rolling movement of the embodiment in FIG. 7, results for a reduction of the friction and wear.

Additionally, the movable rail 4 can be rotated into any arbitrary rotated position about the axes standing perpendicular to the plane of the drawing for a corresponding co-rotation of the forces required for stabilization.

Depending on the variant the fixed position rail 2' can have a round, quadratic or rectangular cross-section perpendicular to a movement axis of the movable rail 4'.

A non-shown vacuum chamber for a coating plant that can be used with an apparatus 50, 50', 50" as described in the foregoing can comprise at least one vacuum pump by means of which the vacuum of $\leq 0.1$ Pa, preferably $\leq 5 \times 10^{-3}$ PA$\leq 5 \times 10^{-7}$ Pa can be produced in the chamber, as well as a flange to which the housing 1 of the apparatus 50, 50', 50" can be connected in order to move the movable rail 4' of the push rod 4 in order to move, for example, the aperture 25 in the vacuum chamber.

In this connection it should be noted that the balls 5 can have a ball diameter of 0.5 mm up to 1 m, however preferably balls 5 having a ball diameter in the range of 3 mm up to 15 mm are used. Having regard to the balls 5 shown here diameters of 8 mm are used.

The coupling magnets shown here have a magnetic field strength of 0.5 T. In dependence on the material of the tube 2, as well as of the wall thickness of the tube 2, a magnetic field strength in the range of 0.2 T to 1 T can be used.

Preferably balls 5 of stainless steel are used in the apparatus 50, 50', 50", however, balls 5 of silicon or silicon alloys or ceramic balls for example of zirconium dioxide can be used as balls 5.

LIST OF REFERENCE NUMERALS

1, 1' housing, flange
2, 2' stainless steel tube, fixed position rail
3 cover plate
4, 4' push rod, movable rail
5 ball
6 inner surface of 2
7, 7' unit, magnetic trolley
8 round magnet
9 tappet
10 coupling web
11 bore
12 recess
13 separate surface
14 abutment
15 roller
16, 16' glide plate, outer surface
17 magnetic trolley guide
18 guide groove
19 safety clip
20 holding ring
21 guide frame
22 groove
23 fastening apertures
24 opening
25 aperture
26 central body
50, 50', 50" apparatus, shutter mechanism, apparatus
L longitudinal axis

The invention claimed is:

1. An apparatus for sliding friction free and lubricant free movement in vacuum, the apparatus comprising:
   a fixed position rail,
   a rail movable by means of magnetic force,
   at least two, at most four, spherical-shaped bodies that are configured to enable a movement of the movable rail relative to the fixed position rail, wherein the spherical-shaped bodies are arranged between the fixed position rail and the movable rail, as well as a unit which is configured to move the movable rail by means of magnetic coupling relative to the fixed position rail and to hold the movable rail stationary after movement of the movable rail.

2. The apparatus according to claim 1, wherein the spherical-shaped bodies are configured to enable a linear movement of the movable rail relative to the fixed position rail.

3. The apparatus in accordance with claim 1, wherein the movable rail has a separate surface for each spherical-shaped body at which the spherical-shaped body contacts the separate surface.

4. The apparatus in accordance with claim 3, wherein each separate surface has two abutments.

5. The apparatus in accordance with claim 4, wherein each spherical-shaped body is configured to be guided linearly to and fro between the two abutments.

6. The apparatus in accordance with claim 4, wherein a path length which the movable rail travels is formed by a spacing between the two abutments.

7. The apparatus in accordance with claim 4, wherein the two abutments are provided at the movable rail or at the fixed position rail.

8. The apparatus in accordance with claim 4, wherein the movable rail has at least two recesses, and wherein each recess is configured to receive one spherical-shaped body.

9. The apparatus in accordance with claim 8, wherein each recess has the separate surface and the two abutments.

10. The apparatus in accordance with claim 9, wherein the two abutments are arranged at least substantially perpendicular to the separate surface and the separate surface is arranged at least substantially in parallel to the fixed position rail.

11. The apparatus in accordance with claim 8, wherein the movable rail has a coupling web which is configured for the magnetic coupling with the unit; and wherein a movement of the movable rail relative to the fixed position rail is induced by a movement of the coupling web; and wherein the coupling web is provided adjoining at least one recess.

12. The apparatus in accordance with claim 11, wherein the coupling web is provided between the two recesses.

13. The apparatus in accordance with claim 1, wherein the movable rail comprises a coupling web that is configured for the magnetic coupling with the unit; and wherein the movement of the movable rail relative to the fixed position rail is induced by a movement of the coupling web.

14. The apparatus in accordance with claim 1, wherein at least one guide groove is provided at the movable rail in which the spherical-shaped bodies are guided in order to predefine the linear movement of the movable rail.

15. The apparatus in accordance with claim 1, wherein at least one guide groove is provided at the fixed position rail in which the spherical-shaped bodies are guided.

16. The apparatus in accordance with claim 1, wherein two spherical-shaped bodies are arranged in a plane in parallel to a linear movement direction of the movable rail.

17. The apparatus in accordance with claim 1, wherein the unit comprises magnetic material and at least a pair of oppositely polarized magnets which make available the magnetic coupling with respect to the movable rail.

18. The apparatus in accordance with claim 1, wherein the unit further comprises two rollers by means of which the unit is displaceable relative to the fixed position rail.

19. The apparatus in accordance with claim 1, wherein the unit is arranged in a guide which predefines a movement range of the unit.

20. The apparatus in accordance with claim 1, wherein the fixed position rail is arranged between the unit and the movable rail, with the unit being configured to move the movable rail relative to the fixed position rail.

21. The apparatus in accordance with claim 1, wherein the movable rail and/or the coupling web comprises a magnetic material.

22. The apparatus in accordance with claim 1, wherein the unit comprises magnets that are configured to move the movable rail and to hold the movable rail stationary.

23. The apparatus in accordance with claim 1, wherein the movable rail is configured as a push rod in order to push objects that are arranged at the push rod.

24. The apparatus in accordance with claim 1, wherein the fixed position rail is formed by at least one chamber wall of a vacuum chamber.

25. A vacuum chamber for a coating plant having an apparatus and a push rod, the apparatus comprising: a fixed position rail, a rail movable by means of magnetic force, at least two, at most four, spherical-shaped bodies that are configured to enable a movement of the movable rail relative to the fixed position rail, wherein the spherical-shaped bodies are arranged between the fixed position rail and the movable rail, as well as a unit which is configured to move the movable rail by means of magnetic coupling relative to the fixed position rail and to hold the movable rail stationary after movement of the movable rail, with the apparatus being configured to move the push rod in the vacuum chamber.

* * * * *